United States Patent
Ji et al.

(10) Patent No.: US 12,387,777 B2
(45) Date of Patent: Aug. 12, 2025

(54) REFRESH CIRCUIT AND SEMICONDUCTOR MEMORY DEVICE INCLUDING THE SAME

(71) Applicant: SK hynix Inc., Icheon-si (KR)

(72) Inventors: Jung Hwan Ji, Icheon-si (KR); Min Soo Park, Icheon-si (KR); Geun Il Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 136 days.

(21) Appl. No.: 18/521,851

(22) Filed: Nov. 28, 2023

(65) Prior Publication Data

US 2025/0006240 A1    Jan. 2, 2025

(30) Foreign Application Priority Data

Jun. 30, 2023  (KR) .................. 10-2023-0084901

(51) Int. Cl.
*G11C 11/406*    (2006.01)

(52) U.S. Cl.
CPC ...... *G11C 11/40615* (2013.01); *G11C 11/406* (2013.01); *G11C 11/40603* (2013.01)

(58) Field of Classification Search
CPC ........ G11C 11/40615; G11C 11/40603; G11C 11/406
See application file for complete search history.

(56) References Cited

U.S. PATENT DOCUMENTS

| | | | |
|---|---|---|---|
| 7,630,274 B2 * | 12/2009 | Kim ................. | G11C 8/08 365/230.06 |
| 9,455,016 B2 * | 9/2016 | Yang ................. | G11C 11/406 |
| 10,854,270 B2 | 12/2020 | Smith et al. | |
| 11,222,686 B1 * | 1/2022 | Noguchi ............ | G11C 7/065 |
| 2004/0205426 A1 | 10/2004 | Muranaka et al. | |
| 2006/0209610 A1 * | 9/2006 | Dono ................ | G11C 11/406 365/222 |
| 2010/0142301 A1 * | 6/2010 | Tashiro ............ | G11C 11/40615 365/201 |
| 2015/0063049 A1 * | 3/2015 | Yang ................. | G11C 29/783 365/222 |
| 2015/0363261 A1 | 12/2015 | Warnes et al. | |
| 2016/0005452 A1 * | 1/2016 | Bae .................... | G06F 11/1048 714/764 |
| 2019/0130959 A1 * | 5/2019 | Moon ................ | G11C 11/406 |
| 2021/0005246 A1 * | 1/2021 | Kim ................... | G11C 11/4085 |
| 2023/0039810 A1 * | 2/2023 | Chen ................. | G11C 11/40611 |

FOREIGN PATENT DOCUMENTS

KR    1020210086692 A    7/2021

* cited by examiner

*Primary Examiner* — Jay W. Radke
(74) *Attorney, Agent, or Firm* — WILLIAM PARK & ASSOCIATES LTD.

(57) ABSTRACT

A refresh circuit is configured to generate a counting signal by counting a refresh command and to generate a plurality of preliminary refresh cycle change signals by decoding the counting signal. The refresh circuit is also configured to change a refresh cycle based on one of the plurality of preliminary refresh cycle change signals and to perform a refresh operation.

19 Claims, 10 Drawing Sheets

FIG. 6

| CMD | XADD<0:N> | RUP_EN | |
|---|---|---|---|
| Ref0 | 0000000000000000 | 0 | |
| Ref1 | 1000000000000000 | 0 | |
| Ref2 | 0000000000000001 | 0 | |
| Ref3 | 1000000000000001 | 0 | |
| Ref4 | 0000000000000010 | 0 | |
| Ref5 | 1000000000000010 | 0 | |
| Ref6 | 0000000000000011 | 0 | |
| Ref7 | 1000000000000011 | 0 | |
| Ref8 | 0000000000000100 | 1 | MSB don't care, SIMULTANEOUSLY ENABLE TWO WLS |
| | 1000000000000100 | 1 | ADDITIONALLY COUNT REFRESH ADDRESS |
| Ref9 | 0000000000000101 | 0 | |
| Ref10 | 1000000000000101 | 0 | |

REFRESH CIRCUIT AND SEMICONDUCTOR MEMORY DEVICE INCLUDING THE SAME

CROSS-REFERENCES TO RELATED APPLICATION

The present application claims priority under 35 U.S.C. § 119(a) to Korean Patent Application No. 10-2023-0084901, filed on Jun. 30, 2023, in the Korean Intellectual Property Office, which is incorporated herein by reference in its entirety.

BACKGROUND

1. Technical Field

The present technology relates to a semiconductor circuit, and particularly, to a refresh circuit and a semiconductor memory device including the same.

2. Related Art

A semiconductor memory device, in particular, a volatile semiconductor memory device essentially requires a refresh operation for retaining a data value written in a memory cell in terms of its characteristic.

Referring to FIG. 1, a common semiconductor memory device performs a refresh operation by sequentially selecting and enabling all word lines WL one by one in response to a refresh command REF.

It is difficult for the semiconductor memory device itself to change a refresh cycle. The refresh cycle of the semiconductor memory device may only be changed by adjusting the timing of the refresh command from outside the semiconductor memory device.

SUMMARY

In an embodiment, a refresh circuit may be configured to generate a counting signal by counting a refresh command, to generate a plurality of preliminary refresh cycle change signals by decoding the counting signal, to change a refresh cycle based on one of the plurality of preliminary refresh cycle change signals, and to perform a refresh operation.

In an embodiment, a refresh circuit may include: a refresh address counter configured to count a refresh address in response to a refresh command; an address decoder configured to enable one word line, among a plurality of word lines, corresponding to the results of the decoding of the refresh address and to simultaneously enable two or more word lines, among the plurality of word lines, in response to a refresh cycle change signal; and a refresh cycle control circuit configured to generate a first counting signal by counting the refresh command, to generate a plurality of preliminary refresh cycle change signals by decoding the first counting signal, to select one of the plurality of preliminary refresh cycle change signals based on a plurality of refresh cycle setting signals, and to output the selected preliminary refresh cycle change signal as the refresh cycle change signal.

In an embodiment, a semiconductor memory device may include: a memory region; a data input/output circuit coupled to the memory region and configured to exchange data between the memory region and a device external to the semiconductor memory device; an error correction code circuit coupled to the data input/output circuit and configured to generate error information by detecting an error of the data; and a refresh circuit configured to generate a plurality of preliminary refresh cycle change signals based on the results of the counting of a refresh command, to select one of the plurality of preliminary refresh cycle change signals in response to a plurality of refresh cycle setting signals or the results of the counting of an error signal, to change a refresh cycle in response to the selected preliminary refresh cycle change signal, and to perform a refresh operation.

BRIEF DESCRIPTION OF THE DRAWINGS

FIG. 6 is a diagram illustrating a refresh command and a change in the refresh address according to a refresh cycle change signal according to an embodiment.

DETAILED DESCRIPTION

Hereinafter, some embodiments of the present technology will be described in detail with reference to the accompanying drawings.

Some embodiments of the present technology provide a refresh circuit capable of adjusting a refresh cycle within a semiconductor memory device and a semiconductor memory device including the same. The present technology can improve operation performance of a semiconductor memory device by adjusting a refresh cycle within the semiconductor memory device.

Figure 1:
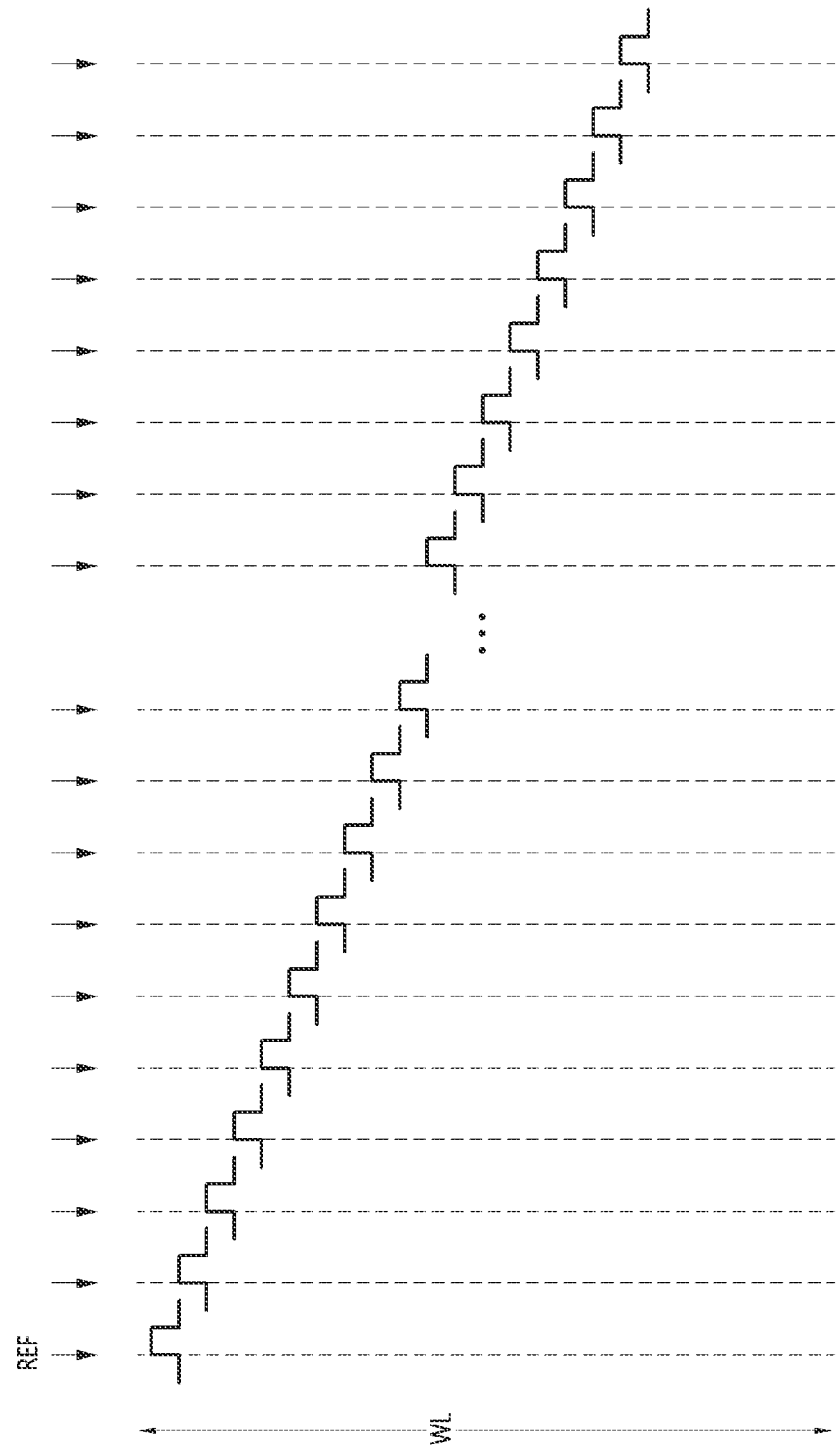
FIG. 1 is a diagram illustrating a common refresh method.
Figure 2:
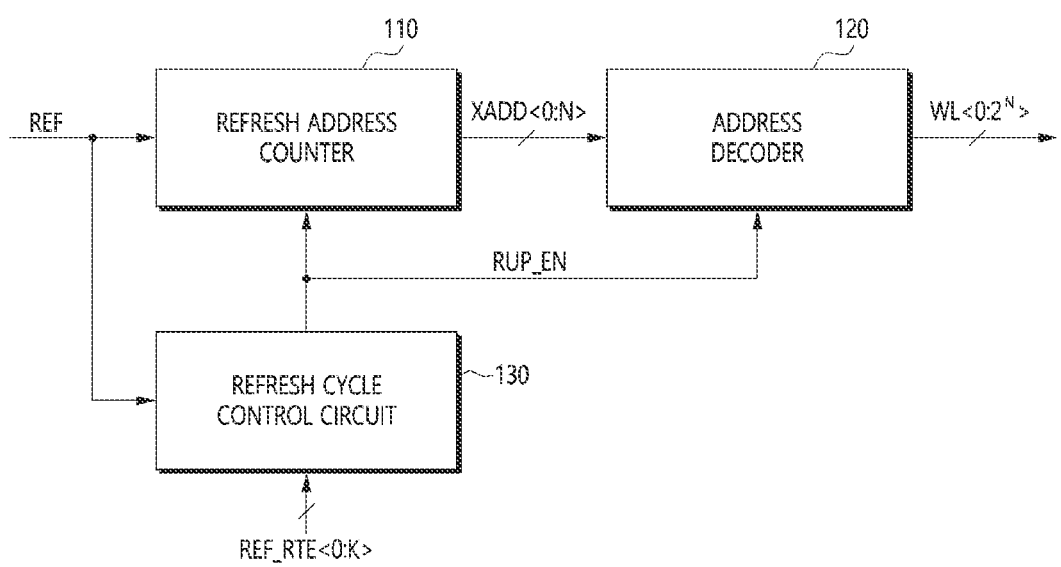
FIG. 2 is a diagram illustrating a construction of a refresh circuit according to an embodiment.

FIG. 2 is a diagram illustrating a construction of a refresh circuit 100 according to an embodiment.

Referring to FIG. 2, the refresh circuit 100 may include a refresh address counter 110, an address decoder 120, and a refresh cycle control circuit 130.

The refresh address counter 110 may receive a refresh command REF and a refresh cycle change signal RUP_EN, and may output refresh address XADD<0:N>. The refresh address counter 110 may perform a count operation on the refresh address XADD<0:N> in response to the refresh command REF. The refresh address counter 110 may count the refresh address XADD<0:N> for the first time in response to the refresh command REF when the refresh cycle change signal RUP_EN is disabled, and may count the refresh address XADD<0:N> for the second time in response to the refresh command REF when the refresh cycle change signal RUP_EN is enabled.

The address decoder 120 may receive the refresh address XADD<0:N> and the refresh cycle change signal RUP_EN. The address decoder 120 may enable one word line corresponding to the results of the decoding of the refresh address XADD<0:N>, among a plurality of word lines WL<0:$2^N$>, and may simultaneously enable two or more word lines, among the plurality of word lines WL<0:2$^N$>, in response to the refresh cycle change signal RUP_EN.

When the refresh cycle change signal RUP_EN is enabled, the address decoder 120 may simultaneously enable two or more word lines, among the plurality of word lines WL<0:2$^N$>, by decoding the refresh address XADD<0:N> regardless of the level of the most significant bit, that is, XADD<N>, of the refresh address XADD<0:N>.

The refresh cycle control circuit 130 may generate a first counting signal by counting the refresh command REF, may generate a plurality of preliminary refresh cycle change signals by decoding the first counting signal, may select one of the plurality of preliminary refresh cycle change signals in response to a plurality of refresh cycle setting signals REF_RTE<0:K>, and may output the selected preliminary refresh cycle change signal as the refresh cycle change signal RUP_EN. The plurality of refresh cycle setting signals REF_RTE<0:K> may be provided from the outside of a semiconductor device, that is, the outside of a semiconductor device to which the refresh circuit 100 has been applied. The values of the plurality of refresh cycle setting signals REF_RTE<0:K> may be varied by outside control. The refresh circuit 100 and the plurality of word lines WL<0:2$^N$> are included in the semiconductor memory device.

Figure 3:
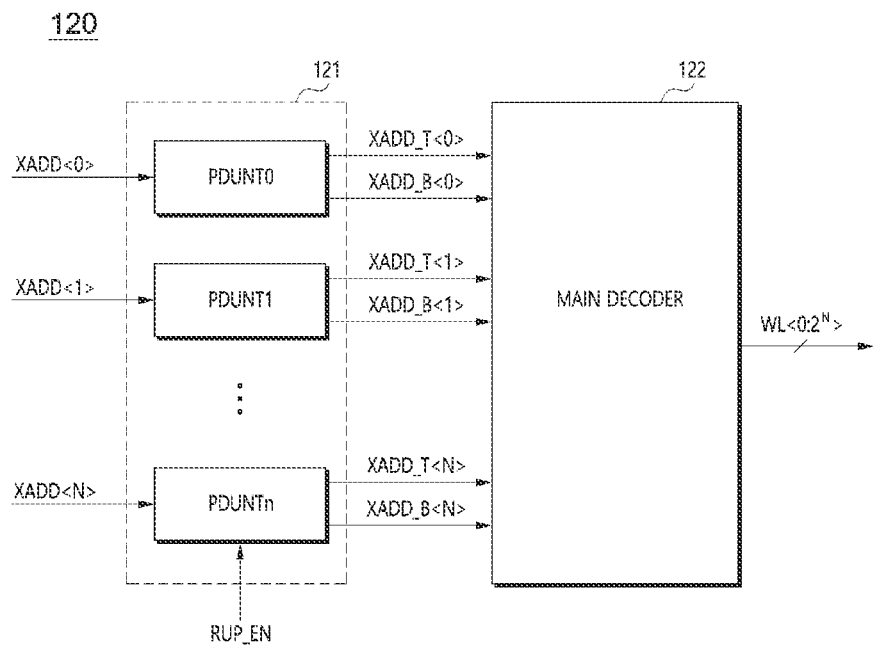
FIG. 3 is a diagram illustrating a construction of an address decoder illustrated in FIG. 2.

FIG. 3 is a diagram illustrating a construction of the address decoder 120 illustrated in FIG. 2.

Referring to FIG. 3, the address decoder 120 may include a pre-decoder 121 and a main decoder 122.

The pre-decoder 121 may receive the refresh address XADD<0:N> and the refresh cycle change signal RUP_EN, and may output a plurality of pre-decoding signal pairs XADD_T<0>/XADD_B<0> to XADD_T<N>/XADD_B<N>.

The pre-decoder 121 may generate the plurality of pre-decoding signal pairs XADD_T<0>/XADD_B<0> to XADD_T<N>/XADD_B<N> by decoding the refresh address XADD<0:N>, and may enable both the pre-decoding signal pair XADD_T<N>/XADD_B<N> corresponding to the most significant bit XADD<N> of the refresh address XADD<0:N>, regardless of the level of the most significant bit XADD<N> in response to the enabling of the refresh cycle change signal RUP_EN.

The pre-decoder 121 may include a plurality of pre-decoding units PDUNT0 to PDUNTn. The plurality of pre-decoding units PDUNT0 to PDUNTn may receive the refresh address XADD<0:N> in one bit unit, and may generate the plurality of pre-decoding signal pairs XADD_T<0>/XADD_B<0> to XADD_T<N>/XADD_B<N>, respectively, by decoding the refresh address XADD<0:N>.

The main decoder 122 may enable at least one of the plurality of word lines WL<0:2$^N$> based on the results of the decoding of the plurality of pre-decoding signal pairs XADD_T<0>/XADD_B<0> to XADD_T<N>/XADD_B<N>.

Figure 4:
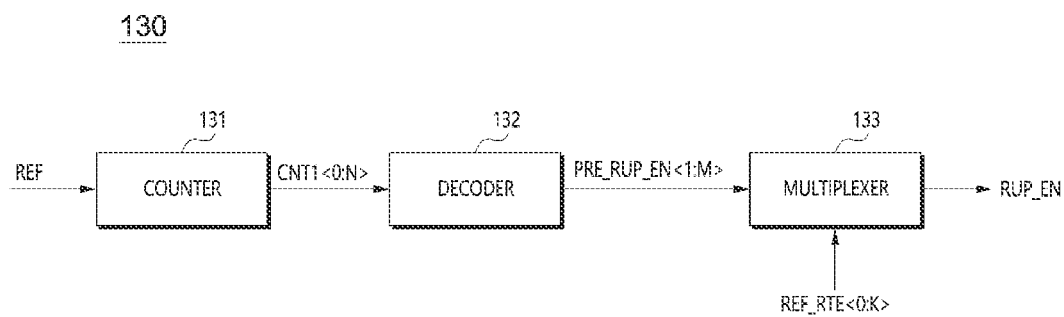
FIG. 4 is a diagram illustrating a construction of a refresh cycle control circuit illustrated in FIG. 2.

FIG. 4 is a diagram illustrating a construction of the refresh cycle control circuit 130 illustrated in FIG. 2.

Referring to FIG. 4, the refresh cycle control circuit 130 may include a counter 131, a decoder 132, and a multiplexer 133.

The counter 131 may generate a first counting signal CNT1<0:N> by counting the refresh command REF.

The decoder 132 may generate a plurality of preliminary refresh cycle change signals PRE_RUP_EN<1:M> by decoding the first counting signal CNT1<0:N>.

The decoder 132 may enable each of the plurality of preliminary refresh cycle change signals PRE_RUP_EN<1:M> whenever the first counting signal CNT1<0:N> has a value of the refresh command REF that has been counted a predetermined number of times.

The multiplexer 133 may select one of the plurality of preliminary refresh cycle change signals PRE_RUP_EN<1:M> in response to the plurality of refresh cycle setting signals REF_RTE<0:K>, and may output the selected preliminary refresh cycle change signal as the refresh cycle change signal RUP_EN.

The multiplexer 133 may disable the refresh cycle change signal RUP_EN regardless of the plurality of preliminary refresh cycle change signals PRE_RUP_EN<1:M> in response to one of the plurality of refresh cycle setting signals REF_RTE<0:K>, for example, the refresh cycle setting signal REF_RTE<0>.

When the refresh cycle setting signal REF_RTE<0> is enabled, the multiplexer 133 may allow the refresh circuit 100 to perform a refresh operation having a fixed cycle by deactivating the refresh cycle change signal RUP_EN regardless of the plurality of preliminary refresh cycle change signals PRE_RUP_EN<1:M>.

Figure 5:
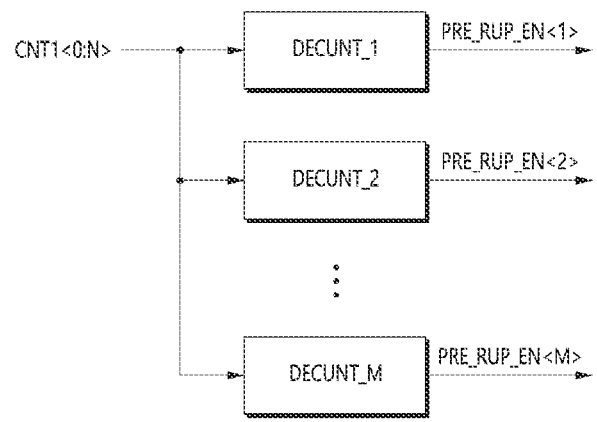
FIG. 5 is a diagram illustrating a construction of a decoder illustrated in FIG. 4.

FIG. 5 is a diagram illustrating a construction of the decoder 132 illustrated in FIG. 4.

Referring to FIG. 5, the decoder 132 may include a plurality of decoding units DECUNT_1 to DECUNT_M.

Each of the plurality of decoding units DECUNT_1 to DECUNT_M may enable each of the plurality of preliminary refresh cycle change signals PRE_RUP_EN<1:M> whenever the first counting signal CNT1<0:N> has a value of the refresh command REF that has been counted a predetermined number of times.

For example, the decoding unit DECUNT_1 may enable the preliminary refresh cycle change signal PRE_RUP_EN<1> whenever the first counting signal CNT1<0:N> has a value of the refresh command REF that has been counted for the ninth time.

The decoding unit DECUNT_2 may enable the preliminary refresh cycle change signal PRE_RUP_EN<2> whenever the first counting signal CNT1<0:N> has a value of the refresh command REF that has been counted for the seventh time.

Each of the remaining decoding units DECUNT_3 to DECUNT_M may enable each of the preliminary refresh cycle change signals PRE_RUP_EN<3:M> whenever the first counting signal CNT1<0:N> has a value of the refresh command REF that has been counted by a set number of times.

Figure 7:
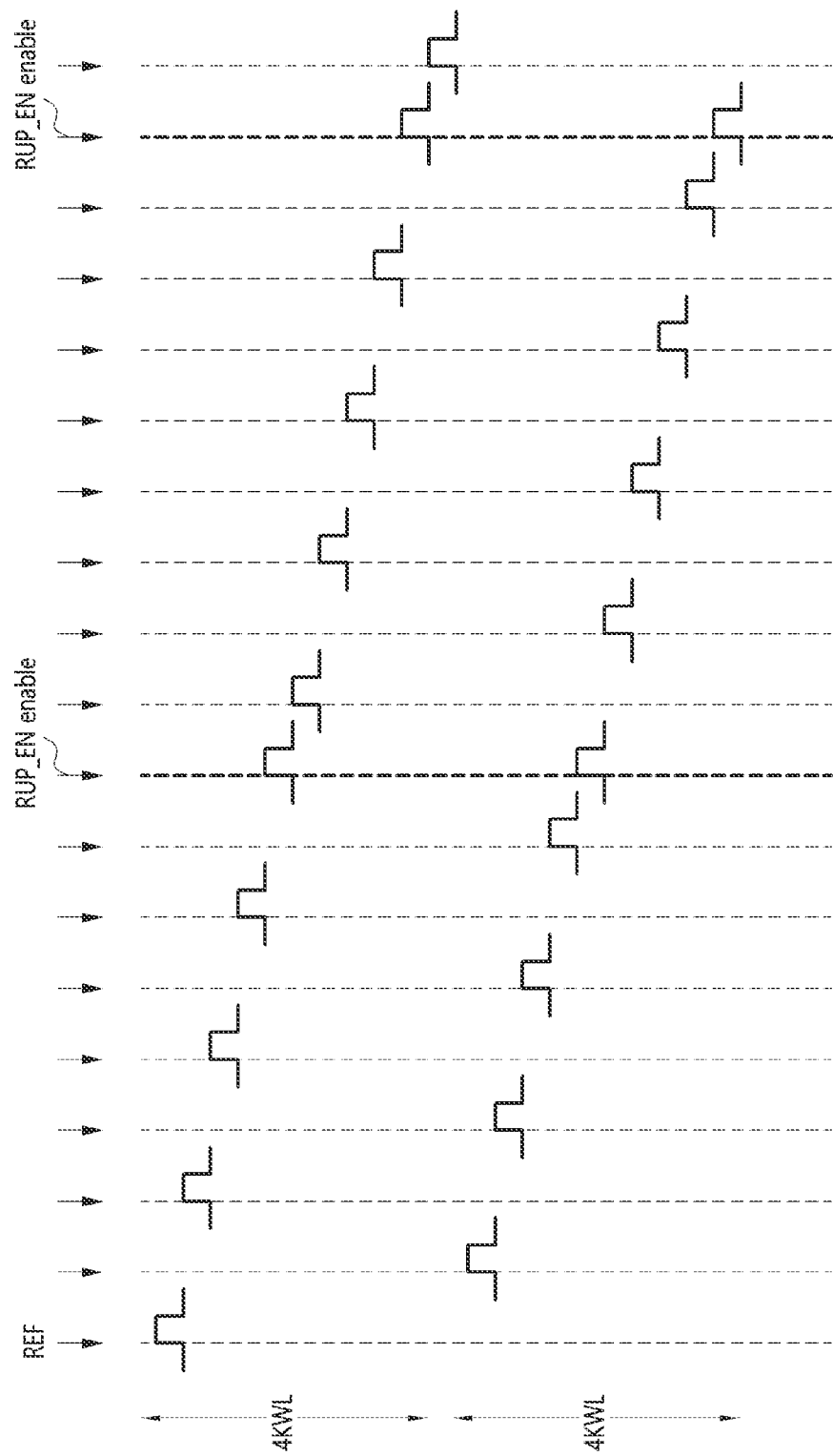
FIGS. 7 and 8 are diagrams illustrating a change in the refresh cycle according to the refresh cycle change signal.
Figure 8:
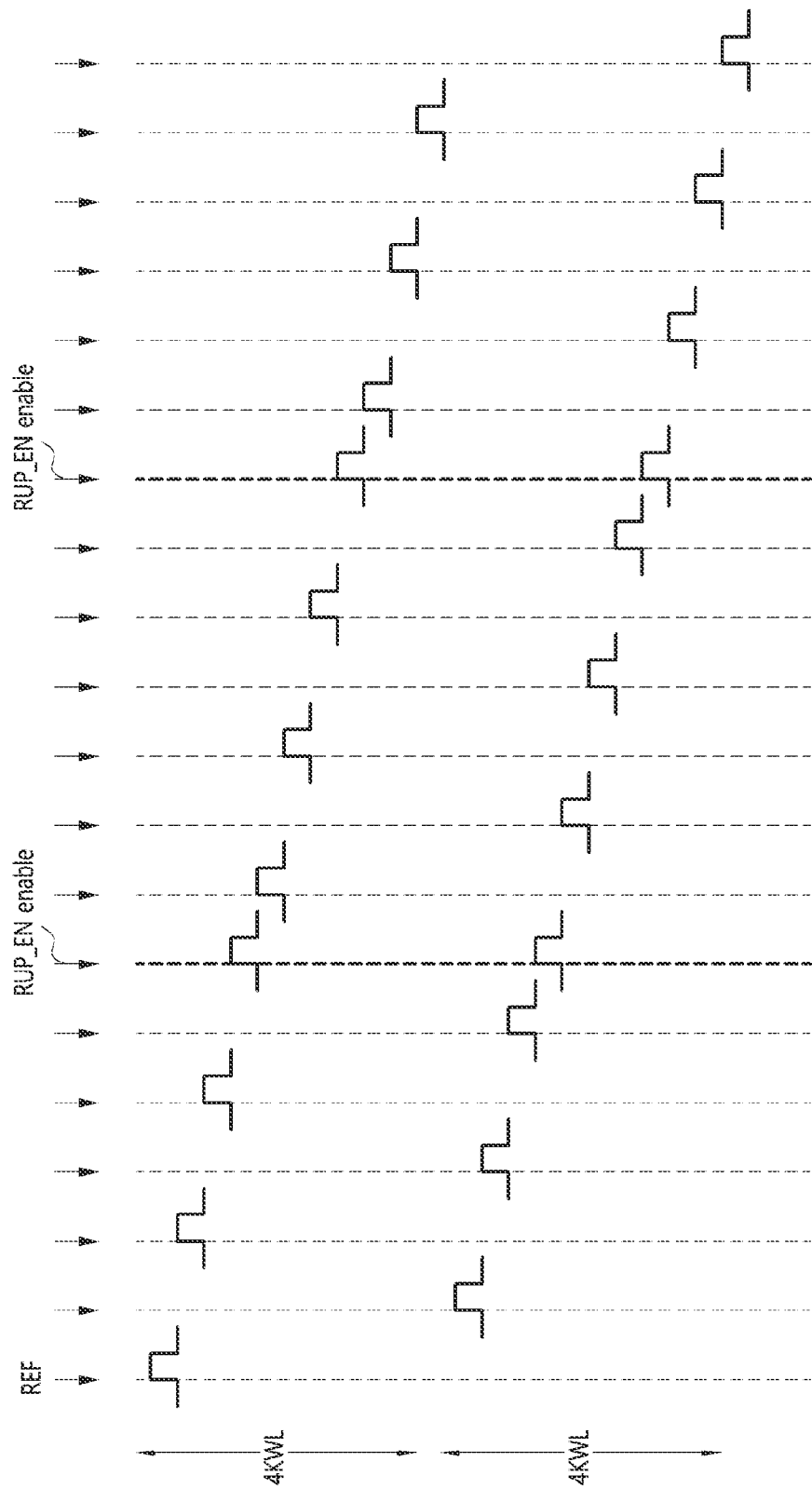

FIG. 6 is a diagram illustrating the refresh command and a change in the refresh address according to the refresh cycle change signal according to an embodiment. FIGS. 7 and 8 are diagrams illustrating a change in the refresh cycle according to the refresh cycle change signal.

Hereinafter, a refresh operation of the refresh circuit 100 according to an embodiment is described with reference to FIGS. 6 to 8.

First, a refresh operation when any one of the plurality of refresh cycle setting signals REF_RTE<0:K>, for example, the refresh cycle setting signal REF_RTE<1> is enabled is described with reference to FIGS. 6 and 7.

The refresh commands REF may be sequentially input. For example, the first refresh command may be named REF0, the second refresh command may be named REF1, and the third refresh command may be named REF2.

As the first refresh command REF0 is input, the refresh address XADD<0:N> (assuming that N=14) may have a value of "000000000000000". As one word line corresponding to the refresh address "000000000000000", among all of the word lines, for example, half (for convenience of sake, 4KWL that is an upper half) of 8K word lines, is enabled as in FIG. 7, a refresh operation may be performed. The refresh cycle change signal RUP_EN may be disabled to a low level because the preliminary refresh cycle change signal PRE_RUP_EN<1> corresponding to the refresh cycle setting signal REF_RTE<1> that has been enabled is in a deactivation state.

As the second refresh command REF1 is input, the refresh address XADD<0:N> increases to "100000000000000". As one word line corresponding to the refresh address "100000000000000", among all of the word lines, for example, the remaining half (for convenience of sake, 4KWL that is a lower half) of the 8K word lines is enabled as in FIG. 7, a refresh operation may be performed. The refresh cycle change signal RUP_EN may maintain the deactivation state.

In this manner, when the refresh commands REF are sequentially input and the ninth refresh command REF8 is input, the refresh address XADD<0:N> increases to "000000000000100". The preliminary refresh cycle change signal PRE_RUP_EN<1> may be enabled in response to the first counting signal CNT1<0:N> corresponding to the counting of the ninth refresh command REF8, so that the refresh cycle change signal RUP_EN is enabled to a high level. When the refresh cycle change signal RUP_EN is enabled, the address decoder 120 may simultaneously enable two word lines, that is, one word line in the 4KWL, that is, the upper half, and one word line in the 4KWL, that is, the lower half, as in FIG. 7 by decoding the refresh address XADD<0:N> regardless of logic value of the most significant bit XADD<N> of the refresh address XADD<0:N>. Furthermore, the refresh address counter 110 may additionally count the refresh address XADD<0:N> when the refresh cycle change signal RUP_EN is enabled.

A refresh cycle can be adjusted to match the refresh cycle setting signal REF_RTE<1> in a way to perform a refresh by simultaneously enabling two word lines whenever the refresh command REF is input a predetermined number of times, for example, for the ninth time as in FIG. 7.

Next, a refresh operation when any one of the plurality of refresh cycle setting signals REF_RTE<0:K>, for example, the refresh cycle setting signal REF_RTE<2> is enabled is described with reference to FIG. 8.

When the refresh commands REF are sequentially input and the seventh refresh command is input, the preliminary refresh cycle change signal PRE_RUP_EN<2> is enabled in response to the first counting signal CNT1<0:N> corresponding to the counting of the seventh refresh command. Accordingly, the refresh cycle change signal RUP_EN is enabled to a high level. When the refresh cycle change signal RUP_EN is enabled, the address decoder 120 may simultaneously enable two word lines, that is, one word line in the 4KWL, that is, the upper half, and one word line in the 4KWL, that is, the lower half, by decoding the refresh address XADD<0:N> regardless of the logic value of the most significant bit XADD<N> of the refresh address XADD<0:N>. Furthermore, the refresh address counter 110 may additionally count the refresh address XADD<0:N> when the refresh cycle change signal RUP_EN is enabled.

A refresh cycle can be adjusted based on the refresh cycle setting signal REF_RTE<2> in a way to perform a refresh by simultaneously enabling two word lines whenever the refresh command REF is input a predetermined number of times, for example, for the seventh time as in FIG. 8.

As described above, the refresh circuit 100 according to an embodiment can differently adjust refresh cycles based on the plurality of refresh cycle setting signals REF_RTE<0:K>, respectively.

Figure 9:
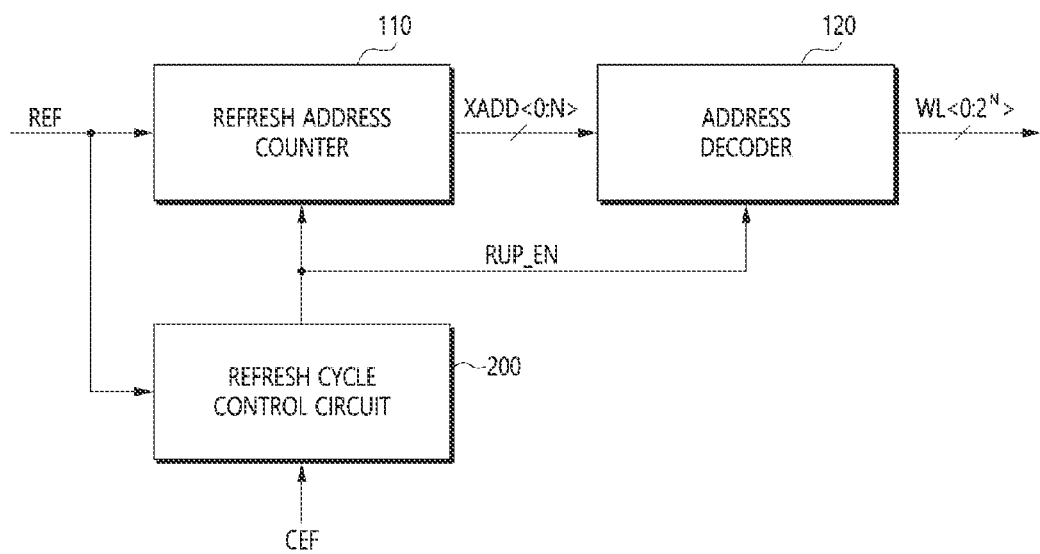
FIG. 9 is a diagram illustrating a construction of a refresh circuit according to an embodiment.

FIG. 9 is a diagram illustrating a construction of a refresh circuit 100A according to an embodiment.

Referring to FIG. 9, the refresh circuit 100A according to an embodiment may be configured to generate a counting signal by counting a refresh command REF, generate a plurality of preliminary refresh cycle change signals by decoding the counting signal, and perform a refresh operation by changing a refresh cycle in response to one of the plurality of preliminary refresh cycle change signals. The refresh circuit 100A may select one of the plurality of preliminary refresh cycle change signals based on the results of the counting of an error signal CEF that is provided from within a semiconductor device associated with the refresh circuit 100A.

The refresh circuit 100A may include a refresh address counter 110, an address decoder 120, and a refresh cycle control circuit 200.

The refresh address counter 110 may receive the refresh command REF and a refresh cycle change signal RUP_EN, and may output a refresh address XADD<0:N>. The refresh address counter 110 may perform a count operation on the refresh address XADD<0:N> in response to the refresh command REF. The refresh address counter 110 may count the refresh address XADD<0:N> for the first time in response to the refresh command REF when the refresh cycle change signal RUP_EN is disabled, and may count the refresh address XADD<0:N> for the second time in response to the refresh command REF when the refresh cycle change signal RUP_EN is enabled.

The address decoder 120 may receive the refresh address XADD<0:N> and the refresh cycle change signal RUP_EN, and may have an output stage connected to a plurality of word lines WL<0:2$^N$>. The address decoder 120 may enable one word line corresponding to the results of the decoding of the refresh address XADD<0:N>, among the plurality of word lines WL<0:2$^N$>, and may simultaneously enable two or more word lines, among the plurality of word lines WL<0:2$^N$>, in response to the refresh cycle change signal RUP_EN.

When the refresh cycle change signal RUP_EN is enabled, the address decoder 120 may simultaneously enable two or more word lines, among the plurality of word lines WL<0:2$^N$>, by decoding the refresh address XADD<0:N> regardless of the level of the most significant bit of the refresh address XADD<0:N>.

The refresh cycle control circuit 200 may generate a first counting signal by counting the refresh command REF, may generate the plurality of preliminary refresh cycle change signals by decoding the first counting signal, may select one of the plurality of preliminary refresh cycle change signals based on the results of the counting of the error signal CEF, and may output the selected preliminary refresh cycle change signal as the refresh cycle change signal RUP_EN.

Figure 10:
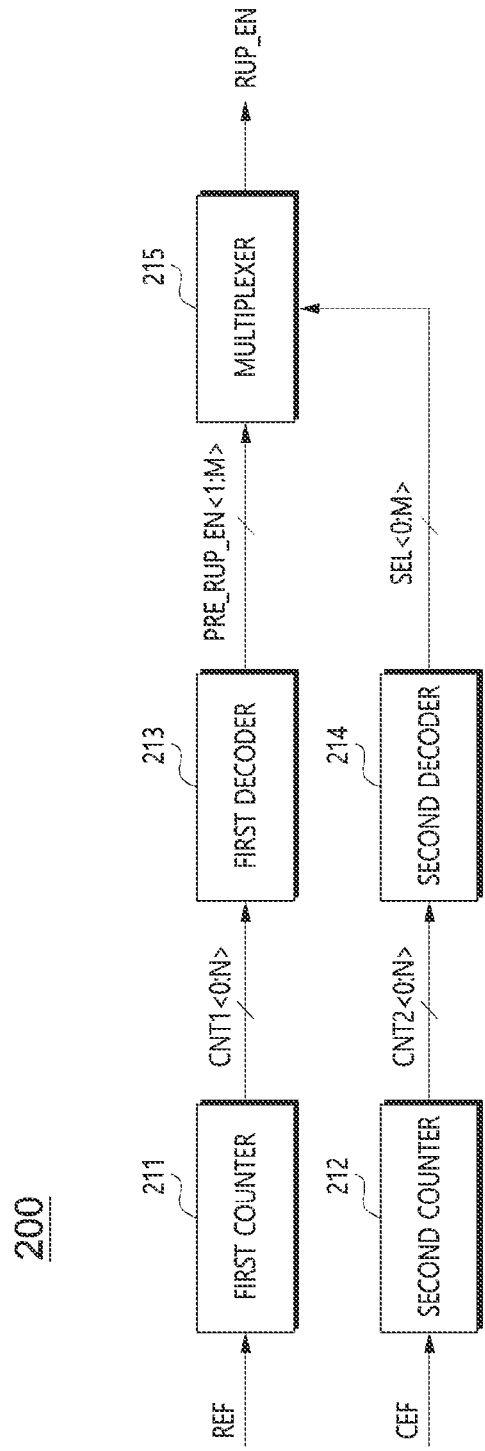
FIG. 10 is a diagram illustrating a construction of a refresh cycle control circuit illustrated in FIG. 9.

FIG. 10 is a diagram illustrating a construction of the refresh cycle control circuit 200 illustrated in FIG. 9.

Referring to FIG. 10, the refresh cycle control circuit 200 may include a first counter 211, a second counter 212, a first decoder 213, a second decoder 214, and a multiplexer 215.

The first counter 211 may generate a first counting signal CNT1<0:N> by counting the refresh command REF.

The second counter 212 may generate a second counting signal CNT2<0:N> by counting the error signal CEF.

The first decoder 213 may generate the plurality of preliminary refresh cycle change signals PRE_RUP_EN<1:M> by decoding the first counting signal CNT1<0:N>.

The first decoder 213 may enable each of the plurality of preliminary refresh cycle change signals PRE_RUP_EN<1:M> whenever the first counting signal CNT1<0:N> has a value of the refresh command REF that has been counted a predetermined number of times.

The second decoder 214 may generate a plurality of selection signals SEL<0:M> by decoding the second counting signal CNT2<0:N>.

The second decoder 214 may include a plurality of decoding units as in FIG. 5. Each of the plurality of decoding units may enable each of the plurality of selection signals SEL<1:M> whenever the second counting signal CNT2<0:N> has a value that has been counted a predetermined number of times. One of the plurality of decoding units may enable the selection signal SEL<0> when the second counting signal CNT2<0:N> has a value of "0", that is, before the error signal CEF occurs, by decoding the second counting signal CNT2<0:N>.

The multiplexer 215 may select one of the plurality of preliminary refresh cycle change signals PRE_RUP_EN<1:M> in response to the plurality of selection signals SEL<0:M>, and may output the selected preliminary refresh cycle change signal as the refresh cycle change signal RUP_EN.

The multiplexer 215 may disable the refresh cycle change signal RUP_EN regardless of the plurality of preliminary refresh cycle change signals PRE_RUP_EN<1:M> in response to the enabling of the selection signal SEL<0>.

When the selection signal SEL<0> is enabled, the multiplexer 215 may disenable the refresh cycle change signal RUP_EN regardless of the plurality of preliminary refresh cycle change signals PRE_RUP_EN<1:M> so that the refresh circuit 100A performs a refresh operation having a fixed cycle.

As described above, the refresh circuit 100A according to another embodiment can vary a refresh cycle based on the results of the counting of the error signal CEF. For example, the refresh circuit 100A can vary the refresh cycle based on the number of times that the error signal CEF has occurred.

Figure 11:
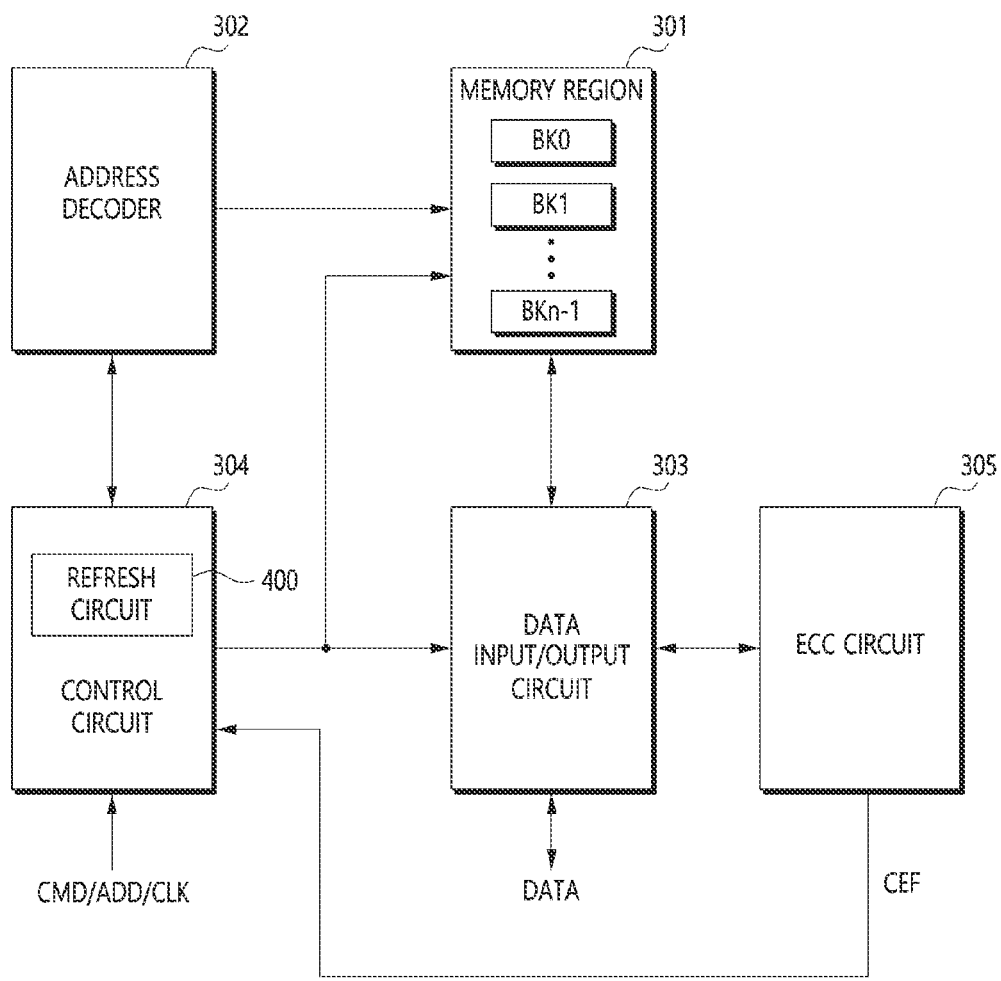
FIG. 11 is a diagram illustrating a construction of a semiconductor memory device according to an embodiment.

FIG. 11 is a diagram illustrating a construction of a semiconductor memory device 300 according to an embodiment.

The semiconductor memory device 300 according to an embodiment may include a memory region 301, an address decoder 302, a data input/output circuit 303, a control circuit 304, and an error correction code (ECC) circuit 305.

The memory region 301 may include a plurality of memory cells and a plurality of word lines. The plurality of memory cells may include at least one of volatile memory and nonvolatile memory. The volatile memory may include static RAM (SRAM), dynamic RAM (DRAM), and synchronous DRAM (SDRAM). The nonvolatile memory may include read only memory (ROM), programmable ROM (PROM), electrically erasable PROM (EEPROM), electrically programmable ROM (EPROM), flash memory, phase change RAM (PRAM), magnetic RAM (MRAM), resistive RAM (RRAM), and ferroelectric RAM (FRAM). After the start of a read operation of the semiconductor memory device 300, data that have been stored in the memory region 301 may be output. After the start of a write operation of the semiconductor memory device 300, data that have been input from an external system, for example, a memory controller or test equipment may be stored in the memory region 301. Memory cells of the memory region 301 may be divided into a plurality of unit memory regions, for example, a plurality of memory banks BK0 to BKn−1.

The address decoder 302 may be connected to the control circuit 304 and the memory region 301. The address decoder 302 may decode an address signal that is provided by the control circuit 304, and may enable at least one of a plurality of word lines of the memory region 301 in response to the results of the decoding.

The data input/output circuit 303 may be connected to the memory region 301. The data input/output circuit 303 may exchange data with an external system or the memory region 301. The data input/output circuit 303 may include a data input buffer, a data output buffer, a data input and output pad DQ, a pipe register, and a test-related circuit.

The ECC circuit 305, that is, an error correction code circuit, may be connected to the data input/output circuit 303. The ECC circuit 305 may exchange data with the data input/output circuit 303. The ECC circuit 305 may perform an error information processing operation of generating a parity bit and syndrome information based on data and generating information with regard to an error that is included in data by using syndrome information and a data correction operation of correcting an error of data. The ECC circuit 305 may generate the error signal CEF by detecting an error in an error information processing operation, and may output the error signal CEF. The error signal CEF may be a signal that defines a correctable error.

The control circuit 304 may be connected to the memory region 301, the address decoder 302, and the data input/output circuit 303. The control circuit 304 may perform a test operation, read operation, write operation, and control operation related to the processing of an address of the semiconductor memory device 300. The control circuit 304 may receive a command CMD, an address ADD, and a clock signal CLK through a plurality of pads (not illustrated). The control circuit 304 may provide the data input/output circuit 303 with an address that has been decoded through the address decoder 302.

The control circuit 304 may include a refresh circuit 400. The refresh circuit 400 may be configured to generate the plurality of preliminary refresh cycle change signals based on the results of the counting of the refresh command, select one of the plurality of preliminary refresh cycle change signals in response to the plurality of refresh cycle setting signals or the results of the counting of the error signal, and perform a refresh operation by changing a refresh cycle in response to the selected preliminary refresh cycle change signal.

The refresh circuit 400 may be constructed identically with the refresh circuit 100 that has been described with reference to FIG. 2 or the refresh circuit 100A that has been described with reference to FIG. 9. The refresh circuit 400 may receive the plurality of refresh cycle setting signals from outside of the semiconductor memory device. The refresh circuit 400 may receive the error signal CEF from the ECC circuit 305.

The semiconductor memory device 300 according to an embodiment can differently adjust a refresh cycle in response to each of the plurality of refresh cycle setting signals REF_RTE<0:K>.

The semiconductor memory device 300 according to an embodiment can vary a refresh cycle based on the results of the counting of the error signal CEF. For example, the semiconductor memory device 300 can vary the refresh cycle based on the number of times that the error signal CEF has occurred.

As described above, those skilled in the art to which the present technology pertains may understand that the present technology may be implemented in various other forms without departing from the technical spirit or essential characteristics of the present technology. Accordingly, it is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

What is claimed is:

1. A refresh circuit configured to:
   generate a counting signal by counting a refresh command,
   generate a plurality of preliminary refresh cycle change signals by decoding the counting signal,
   change a refresh cycle in response to one of the plurality of preliminary refresh cycle change signals, and
   perform a refresh operation.

2. The refresh circuit according to claim 1, wherein the refresh circuit is configured to select one of the plurality of preliminary refresh cycle change signals in response to a plurality of refresh cycle setting signals that are provided from outside of a semiconductor device to which the refresh circuit has been applied.

3. The refresh circuit according to claim 1, wherein the refresh circuit is configured to select one of the plurality of preliminary refresh cycle change signals based on results of a counting of an error signal that is provided within a semiconductor device to which the refresh circuit has been applied.

4. The refresh circuit according to claim 1, comprising a refresh address counter configured to count a refresh address in response to the refresh command.

5. The refresh circuit according to claim 4, wherein the refresh address counter is configured to:
   count the refresh address for a first time in response to the refresh command when a refresh cycle change signal is disabled, and
   count the refresh address for a second time in response to the refresh command when the refresh cycle change signal is enabled.

6. The refresh circuit according to claim 4, further comprising an address decoder configured to:
   enable one word line corresponding to results of a decoding of the refresh address, among a plurality of word lines, and
   simultaneously enable two or more word lines, among the plurality of word lines, in response to a refresh cycle change signal.

7. The refresh circuit according to claim 6, wherein the address decoder comprises:
   a pre-decoder configured to generate a plurality of pre-decoding signal pairs by decoding the refresh address and to enable a pre-decoding signal pair corresponding to a most significant bit of the refresh address regardless of a level of the most significant bit in response to an enabling of the refresh cycle change signal, and
   a main decoder configured to enable at least one of the plurality of word lines in response to the plurality of pre-decoding signal pairs.

8. A refresh circuit comprising:
   a refresh address counter configured to count a refresh address in response to a refresh command;
   an address decoder configured to enable one word line, among a plurality of word lines, corresponding to results of a decoding of the refresh address and to simultaneously enable two or more word lines, among the plurality of word lines, in response to a refresh cycle change signal; and
   a refresh cycle control circuit configured to generate a first counting signal by counting the refresh command, to generate a plurality of preliminary refresh cycle change signals by decoding the first counting signal, to select one of the plurality of preliminary refresh cycle change signals based on results of a counting of an error signal, and to output the selected preliminary refresh cycle change signal as the refresh cycle change signal.

9. The refresh circuit according to claim 8, wherein the refresh address counter is configured to:
   count the refresh address for a first time in response to the refresh command when the refresh cycle change signal is disabled, and
   count the refresh address for a second time in response to the refresh command when the refresh cycle change signal is enabled.

10. The refresh circuit according to claim 8, wherein the address decoder comprises:
    a pre-decoder configured to generate a plurality of pre-decoding signal pairs by decoding the refresh address and to enable a pre-decoding signal pair corresponding to a most significant bit of the refresh address regardless of a level of the most significant bit in response to an enabling of the refresh cycle change signal, and
    a main decoder configured to enable at least one of the plurality of word lines in response to the plurality of pre-decoding signal pairs.

11. The refresh circuit according to claim 8, wherein the refresh cycle control circuit comprises:
    a first counter configured to generate the first counting signal by counting the refresh command;
    a second counter configured to generate a second counting signal by counting the error signal;
    a first decoder configured to generate the plurality of preliminary refresh cycle change signals by decoding the first counting signal;
    a second decoder configured to generate a plurality of selection signals by decoding the second counting signal; and
    a multiplexer configured to select one of the plurality of preliminary refresh cycle change signals in response to the plurality of selection signals and to output the selected preliminary refresh cycle change signal as the refresh cycle change signal.

12. The refresh circuit according to claim 11, wherein the multiplexer is configured to disable the refresh cycle change signal regardless of the plurality of preliminary refresh cycle change signals in response to one of the plurality of selection signals.

13. A semiconductor memory device comprising:
    a memory region;
    a data input/output circuit coupled to the memory region and configured to exchange data between the memory region and a device external to the semiconductor memory device;
    an error correction code circuit coupled to the data input/output circuit and configured to generate error information by detecting an error of the data; and
    a refresh circuit configured to generate a plurality of preliminary refresh cycle change signals based on results of a counting of a refresh command, to select one of the plurality of preliminary refresh cycle change signals in response to a plurality of refresh cycle setting signals or results of a counting of an error signal, to change a refresh cycle in response to the selected preliminary refresh cycle change signal, and to perform a refresh operation.

14. The semiconductor memory device according to claim 13, wherein the semiconductor memory device is configured to receive the plurality of refresh cycle setting signals from outside the semiconductor memory device.

15. The semiconductor memory device according to claim 13, wherein the refresh circuit comprises:
a refresh address counter configured to count a refresh address in response to the refresh command;
an address decoder configured to enable one word line corresponding to results of a decoding of the refresh address, among a plurality of word lines of the memory region, and to simultaneously enable two or more word lines, among the plurality of word lines, in response to a refresh cycle change signal;
a first counter configured to generate a first counting signal by counting the refresh command;
a first decoder configured to generate the plurality of preliminary refresh cycle change signals by decoding the first counting signal; and
a multiplexer configured to select one of the plurality of preliminary refresh cycle change signals in response to the plurality of refresh cycle setting signals and to output the selected preliminary refresh cycle change signal as the refresh cycle change signal.

16. The semiconductor memory device according to claim 15, wherein the refresh address counter is configured to:
count the refresh address for a first time in response to the refresh command when the refresh cycle change signal is disabled, and
count the refresh address for a second time in response to the refresh command when the refresh cycle change signal is enabled.

17. The semiconductor memory device according to claim 15, wherein the address decoder comprises:

a pre-decoder configured to generate a plurality of pre-decoding signal pairs by decoding the refresh address and to enable a pre-decoding signal pair corresponding to a most significant bit of the refresh address regardless of a level of the most significant bit in response to an enabling of the refresh cycle change signal, and
a main decoder configured to enable at least one of the plurality of word lines in response to the plurality of pre-decoding signal pairs.

18. The semiconductor memory device according to claim 15, wherein the multiplexer is configured to disable the refresh cycle change signal regardless of the plurality of preliminary refresh cycle change signals in response to one of the plurality of refresh cycle setting signals.

19. The semiconductor memory device according to claim 13, wherein the refresh circuit comprises:
a refresh address counter configured to count a refresh address in response to the refresh command;
an address decoder configured to enable one word line corresponding to results of a decoding of the refresh address, among a plurality of word lines of the memory region, and to simultaneously enable two or more word lines, among the plurality of word lines, in response to a refresh cycle change signal;
a first counter configured to generate a first counting signal by counting the refresh command;
a second counter configured to generate a second counting signal by counting the error signal;
a first decoder configured to generate the plurality of preliminary refresh cycle change signals by decoding the first counting signal;
a second decoder configured to generate the plurality of selection signals by decoding the second counting signal; and
a multiplexer configured to select one of the plurality of preliminary refresh cycle change signals in response to the plurality of selection signals and to output the selected preliminary refresh cycle change signal as the refresh cycle change signal.

\* \* \* \* \*